(12) United States Patent
Wang

(10) Patent No.: US 11,320,267 B2
(45) Date of Patent: May 3, 2022

(54) INTEGRATED OPTIC WAVEMETER AND METHOD FOR FIBER OPTIC GYROSCOPES SCALE FACTOR STABILIZATION

(71) Applicant: KVH Industries, Inc., Middletown, RI (US)

(72) Inventor: Liming Wang, Tinley Park, IL (US)

(73) Assignee: KVH Industries, Inc., Middletown, RI (US)

( * ) Notice: Subject to any disclaimer, the term of this patent is extended or adjusted under 35 U.S.C. 154(b) by 30 days.

(21) Appl. No.: 15/877,110

(22) Filed: Jan. 22, 2018

(65) Prior Publication Data

US 2018/0274926 A1    Sep. 27, 2018

Related U.S. Application Data

(60) Provisional application No. 62/475,476, filed on Mar. 23, 2017.

(51) Int. Cl.
*G01C 19/72* (2006.01)
*G01B 9/02* (2022.01)
(Continued)

(52) U.S. Cl.
CPC ............. *G01C 19/725* (2013.01); *G01B 9/02* (2013.01); *G01C 19/72* (2013.01); *G01J 3/26* (2013.01);
(Continued)

(58) Field of Classification Search
CPC ..... G01C 19/725; G01C 19/72; G01J 9/0246; G01J 3/26; G01J 2009/023; H01S 5/0687; G01B 9/02; G02B 6/2821
See application file for complete search history.

(56) References Cited

U.S. PATENT DOCUMENTS

| 4,678,267 A | 7/1987 | Burns |
| 4,842,358 A * | 6/1989 | Hall ...................... H01S 5/0687 |
| | | 250/205 |

(Continued)

FOREIGN PATENT DOCUMENTS

| CN | 107843957 | 3/2018 |
| EP | 0279603 A2 | 8/1988 |

(Continued)

OTHER PUBLICATIONS

International Search Report and Written Opinion for PCT/US2018/023472 dated Jun. 29, 2018 entitled "Integrated Optic Wavemeter and Method for Fiber Optic Gyroscopes Scale Factor Stabilization".

(Continued)

*Primary Examiner* — Hwa Andrew Lee
(74) *Attorney, Agent, or Firm* — Hamilton, Brook, Smith & Reynolds, P.C.

(57) ABSTRACT

A system for stabilizing a scale factor associated with an optic rotation sensor comprises an optic rotation sensor that generates an optic signal in response to a rotation of the optic rotation sensor. A sensor detection system produces a rotation signal as a function of the optic signal and rotation of the optic rotation sensor. A first waveguide guides a portion of the optic signal for an interaction length, and produces a first processed optic signal. A second waveguide receives a portion of the optic signal from first waveguide through evanescent coupling, and produces a second processed optic signal. A wavemeter detector receives the optic signals and measures the effective interferometric wavelength (EIW) of the light based on the optic signals. A scale factor correction system receives the rotation signal and the EIW, and measures the correct rotation signal by processing the rotation signal and the EIW.

17 Claims, 11 Drawing Sheets
(7 of 11 Drawing Sheet(s) Filed in Color)

(51) Int. Cl.
*H01S 5/0687* (2006.01)
*G01J 3/26* (2006.01)
*G01J 9/02* (2006.01)
*G02B 6/28* (2006.01)

(52) U.S. Cl.
CPC .......... *G01J 9/0246* (2013.01); *H01S 5/0687* (2013.01); *G01J 2009/023* (2013.01); *G02B 6/2821* (2013.01)

(56) References Cited

U.S. PATENT DOCUMENTS

| | | | |
|---|---|---|---|
| 4,890,922 | A | 1/1990 | Wilson |
| 4,938,594 | A | 7/1990 | Pavlath |
| 4,969,742 | A | 11/1990 | Falk |
| 5,037,205 | A | 8/1991 | Pavlath |
| 5,194,917 | A | 3/1993 | Regener |
| 5,223,911 | A | 6/1993 | Suchoski |
| 5,321,503 | A | 6/1994 | Bramson |
| 5,365,338 | A | 11/1994 | Bramson |
| 5,436,992 | A | 7/1995 | Wang |
| 5,475,771 | A | 12/1995 | Hosoi |
| 5,579,424 | A | 11/1996 | Schneider |
| 5,600,745 | A | 2/1997 | Wuu |
| 5,729,641 | A | 3/1998 | Chandonnet |
| 5,838,844 | A | 11/1998 | Van Dam |
| 5,946,434 | A | 8/1999 | Lee |
| 5,982,961 | A | 11/1999 | Pan |
| 6,108,086 | A | 8/2000 | Michal |
| 6,140,009 | A | 10/2000 | Wolk |
| 6,163,632 | A | 12/2000 | Rickman |
| 6,293,688 | B1 | 9/2001 | Deacon |
| 6,360,038 | B1 | 3/2002 | Grubsky |
| 6,445,455 | B1 | 9/2002 | Hall |
| 6,680,472 | B1 | 1/2004 | Thingboet |
| 6,760,520 | B1 | 7/2004 | Medin |
| 6,905,904 | B2 | 6/2005 | Gardner |
| 6,920,257 | B1 | 7/2005 | Mekis |
| 7,061,610 | B2 | 6/2006 | Mittelstein |
| 7,085,441 | B1 | 8/2006 | Kozlov |
| 7,218,809 | B2 | 5/2007 | Zhou |
| 7,224,878 | B1 | 5/2007 | Wessels |
| 7,899,286 | B2 | 3/2011 | Yoshida |
| 8,121,874 | B1 | 2/2012 | Guheen |
| 9,411,098 | B2 | 8/2016 | Onaka |
| 9,690,045 | B2 | 6/2017 | Goodwill et al. |
| 9,739,938 | B2 | 8/2017 | Shi |
| 9,746,612 | B2 | 8/2017 | Lipson |
| 10,108,789 | B2 | 10/2018 | Lehmann et al. |
| 10,274,319 | B2 | 4/2019 | Wang |
| 10,488,596 | B2 | 11/2019 | Akiyama |
| 10,545,288 | B2 | 1/2020 | Ma |
| 10,921,682 | B1 | 2/2021 | Wang |
| 11,092,748 | B2 | 8/2021 | Wang |
| 2002/0003918 | A1 | 1/2002 | Ooi |
| 2002/0197037 | A1 | 1/2002 | Bailey |
| 2002/0024786 | A1 | 2/2002 | Sanders |
| 2002/0149780 | A1* | 10/2002 | Trinh .................. G01J 9/0246 356/477 |
| 2003/0081092 | A1 | 5/2003 | Blauvelt |
| 2004/0057667 | A1 | 3/2004 | Yamada |
| 2004/0168234 | P1 | 8/2004 | Fischer |
| 2004/0223695 | A1 | 11/2004 | Kersten |
| 2005/0021348 | A1 | 1/2005 | Chan |
| 2005/0025427 | A1 | 2/2005 | Dougherty |
| 2006/0251849 | A1 | 11/2006 | Blauvelt |
| 2007/0053625 | A1 | 3/2007 | Ichioka |
| 2007/0229838 | A1 | 10/2007 | Greening |
| 2008/0291459 | A1 | 11/2008 | Meyer |
| 2009/0087144 | A1 | 4/2009 | Yoshida |
| 2009/0190876 | A1 | 7/2009 | Doi |
| 2010/0137849 | A1 | 6/2010 | Bhandari |
| 2012/0217419 | A1 | 8/2012 | Riesen et al. |
| 2013/0202250 | A1 | 8/2013 | Guattari |
| 2013/0308897 | A1 | 11/2013 | Sercel |
| 2014/0075357 | A1 | 3/2014 | Flores |
| 2014/0185979 | A1 | 7/2014 | Evans |
| 2014/0376001 | A1 | 12/2014 | Swanson |
| 2014/0376083 | A1 | 12/2014 | Onaka |
| 2015/0021291 | A1 | 1/2015 | Shastri |
| 2015/0212271 | A1 | 7/2015 | Chen |
| 2015/0027042 | A1 | 10/2015 | Goodwill |
| 2015/0277156 | A1 | 10/2015 | Kondou |
| 2017/0131472 | A1 | 5/2017 | Kobyakov |
| 2017/0168234 | A1 | 6/2017 | Shi |
| 2017/0192171 | A1 | 7/2017 | Shi |
| 2017/0205578 | A1 | 7/2017 | Van Thourhout |
| 2017/0205583 | A1 | 7/2017 | Bennett |
| 2017/0329082 | A1 | 11/2017 | Ma |
| 2018/0120504 | A1 | 5/2018 | Qi |
| 2018/0259337 | A1 | 9/2018 | Wang |
| 2019/0086614 | A1 | 3/2019 | Wang |
| 2020/0371286 | A1 | 11/2020 | Wang |
| 2021/0048721 | A1 | 2/2021 | Wang |
| 2021/0240050 | A1 | 8/2021 | Khan |

FOREIGN PATENT DOCUMENTS

| | | |
|---|---|---|
| EP | 0379520 A1 | 8/1990 |
| EP | 0883000 A1 | 12/1998 |
| EP | 0893671 | 1/1999 |
| EP | 1025422 A1 | 8/2000 |
| EP | 1396741 A1 | 3/2004 |
| EP | 2096408 A2 | 4/2008 |
| EP | 2246663 A2 | 11/2010 |
| EP | 3454101 A1 | 3/2019 |
| GB | 2201256 A | 8/1988 |
| JP | H08226822 A | 9/1996 |
| JP | H09159869 A | 6/1997 |
| JP | 20070272121 A | 10/2007 |
| JP | 20120215901 A | 11/2012 |
| JP | 2013255086 A | 12/2013 |
| WO | 198901534 A1 | 11/1989 |
| WO | 2015108488 A1 | 7/2015 |
| WO | 2016010528 A1 | 1/2016 |
| WO | 2018165238 A1 | 9/2018 |
| WO | 2018175524 A1 | 9/2018 |
| WO | 2019055663 A1 | 3/2019 |
| WO | 2020077216 A1 | 4/2020 |
| WO | 2020092789 A1 | 5/2020 |
| WO | 2021154970 A1 | 8/2021 |

OTHER PUBLICATIONS

Yu, C., et al., "Stable and Compact Optical Module for Fiber-Optic Gyroscope Application", Fiber and Integrated Optics, 33:306-314, 2014.

Muneeb, M., et al., "Silicon-on-insulator shortwave infrared wavelength meter with integrated photodiodes for on-chip laser monitoring", Nov. 3, 2014 | vol. 22, No. 22 | DOI:10.1364/OE.22.027300 | Optics Express 27300.

Wang, P., et al., "Passive photonic integrated ratiometric wavelength monitor with resolution better than 15 pm", vol. 25, No. 3 | Feb. 6, 2017 | Optics Express 2940.

Wang, P., et al. "Wavelength Measurement Based on a Silicon-on-Insulator Directional Coupler Integrated Device", Sensors 2015, 15 21281.

Hatta, A.M., et al. "Design of the optical core of an integrated ratiometric wavelength monitor" Proceedings 14th European Conference on Integrated Optics: ECIO 08 Eindhoven: Jun. 11-13, 2008, Eindhoven University of Technology, The Netherlands, paper, ThP25.

Florjanczyk, M., et al., "Tiny spectrometer enables cost-effective space-borne sensing" SPIE Newsroom, 10.1117/2.1200912.002524, 2009.

Garanovich, I., et al., "Nonlinear directional coupler for polychromatic light", Optics Letters vol. 32, Issue 5, pp. 475-477 (2007).

Hatta, A.M., et al., "A simple integrated ratiometric wavelength monitor based on a directional coupler", Optik 125 (2014) 795-798.

Leijtens, X., et al., "Arrayed Waveguide Gratings", in "Wavelength Filters in Fibre Optics", vol. 123 of the series Springer Series in Optical Sciences pp. 125-187 (date uknown).

(56) References Cited

OTHER PUBLICATIONS

Bauters, et al., "Ultralow-Loss Planar Si3N4 Waveguide Polarizers," IEEE Photonics Journal, 5(1), Article S/N: 6600207 (2013).
Cheng, Z.J., et al., "Polymer-waveguide-based vertical coupler", Optics Communications, vol. 260, No. 2, Apr. 15, 2006.
Hammer, M., et al., "Hybrid coupled-mode modeling in 3D: perturbed and coupled channels, and waveguide crossings". Journal of Optical Society of America, vol. 34, No. 3, Mar. 1, 2017.
Humaira, Z., et al.: "Integrated silicon photonic TE-pass polarizer", 2016 Photonics North (PN), IEEE, May 24, 2016 (May 24, 2016).
Lallier, E., et al., "Laser Oscillation of Single-Mode Channel Waveguide in ND:MGO:LINB03", Electronic Letters, IEEE Stevenage, GB, vol. 26, No. 22, Oct. 26, 1989.
Seyringer, D., et al., "Arrayed Waveguide Gratings", SPIE Press Book, Date Published: Jun. 3, 2016, ISBN: 9781510603608, vol. SL16.
Shang. K., et al., "Low-loss compact multilayer silicon nitride platform for 3D photonic integrated circuits" Optics Express, vol. 23, No. 16, Aug. 6, 2015.
Srinivasan, S., et al., "Design of integrated hybrid silicon waveguide optical gyroscope", Optics Express 24988, vol. 22, No. 21, Oct. 20, 2014.
Tan, Y. et al., "Polarization-selective microring resonators", Optics Express, vol. 25, No. 4, Feb. 15, 2017 (Feb. 15, 2017).
Tran, M., et al., "Integrated optical driver for interferometric optical gyroscopes", Optics Express 3827,vol. 25, No. 4. Feb. 20, 2017.
International Search Report and Written Opinion for PCT/US2018/021262 dated Jun. 15, 2018 entitled "Photonic Integrated Circuit for an Interference Fiber Optic Gyroscope (IFOG)".
International Search Report and Written Opinion for PCT/US2018/050896 dated Jan. 7, 2019 entitled "Method and Apparatus for Self-Alignment Connection of Optical Fiber to Waveguide of Photonic Integrated Circuit".
International Search Report and Written Opinion for PCT/US2019/055849 dated Mar. 11, 2020, titled "Photonic Integrated Circuits, Fiberoptic Gyroscopes and Methods for Making the Same".
International Search Report and Written Opinion for PCT/US2019/059195 dated Jan. 16, 2020 entitled "Method and Apparatus for Control and Suppression of Stray Light in a Photonic Integrated Circuit".
International Search Report and Written Opinion for PCT/US2020/033092 dated Sep. 4, 2020 titled "Integrated Optical Polarizer and Method of Making Same".
Lu, M., et al., "Field Patterns of the TE Modes in Ridge-Trough Waveguide", International Journal of Infrared and Millimeter Waves, Kluwer Academic Publishers—Plenum Publishers, NE, vol. 23, No. 8, Aug. 1, 2002.
Pu, M., et al., "Ultra-low-loss inverted taper coupler for silicon-on-insulator ridge waveguide", Optics Communications, Elsevier, Amsterdam, NL, vol. 283, No. 19, Oct. 1, 2010.
International Search Report and Written Opinion for PCT/US2020/045877 dated Nov. 9, 2020 titled "Integrated Optical Phase Modulator and Method of Making Same".
Hochber, M., et al., "Silicon photonics: the next fabless semiconductor industry", IEEE Solid-State Circuits Magazine, IEEE, USA, vol. 5, No. 1, Mar. 1, 2013.
Ren, T., et al., "An Integrated Low-Voltage Broadband Lithium Niobate Phase Modulator", IEEE Photonics Technology Letters, vol. 31, No. 11, Jun. 1, 2019.
Sanders, G., et al., "Improvements to Signal Processing and Component Minaturization of Compact Resonator Fiber Optic Gyroscopes", 2018 DGON Inertial Sensors and Systems (ISS), IEEE, Sep. 11, 2018.
Steier, W.H., et al., "Polymer Electro-Optic Devices for Integrated Optics", Chemical Physics, Amsterdam, NL, vol. 245, No. 1-03, Jul. 1, 1999.
International Search Report and Written Opinion for PCT/US2021/015454 dated Jun. 15, 2021 titled "Integrated Modulator Structure for In-situ Power Balancing in Photonic Fiber Optic Gyroscopes".
International Preliminary Report on Patentability for PCT/US2020/033092 dated Dec. 2, 2021 titled "Integrated Optical Polarizer and Method of Making Same".
Park, H., et al. "Device and Integratino Technology for Silicon Photonic Transmitters", IEEE Journal of Selectred Topics in Quantum Electronics, vol. 17, No. 3, May/Jun. 2011.
International Preliminary Report on Patentability for PCT/US2019/055849 dated Apr. 8, 2021, titled "Photonic Integrated Circuits, Fiber Optic Gyroscopes and Methods for Making the Same".
International Search Report and Written Opinion for PCT/US2019/059195 dated May 14, 2021 titled "Method and Apparatus for Control and Suppression of Stray Light in a Photonic Integrated Circuit".

* cited by examiner

INTEGRATED OPTIC WAVEMETER AND METHOD FOR FIBER OPTIC GYROSCOPES SCALE FACTOR STABILIZATION

RELATED APPLICATION

This application claims the benefit of U.S. Provisional Application No. 62/475,476, filed on Mar. 23, 2017, the entire teachings of which are incorporated herein by reference.

BACKGROUND

A fiber optic gyroscope (FOG) employs an optic source to generate light, which is introduced into a fiber sensing coil for use in detecting rotation of the fiber sensing coil. Advantages of using a broadband optic source include (i) high optic power and (ii) a short coherence length. A short coherence length reduces the interference contrast of the various parasitic waves generated in the system by, for example, back-reflection, backscattering, and/or polarization cross-coupling. The short coherence length also suppresses the effects of Kerr nonlinearity, which causes optic non-reciprocity and produces rotation measurement error.

An edge emitting semiconductor diode, based on superluminescence, is one type of optic source typically used in FOG devices. Such an optic source combines the high power and brightness of laser diodes, with the low coherence of conventional light-emitting diodes. Its emission bandwidth is typically between 15 nm and 50 nm. The light emitted from such a broadband superluminescence diode (referred to herein as "SLD") may then be coupled to a rotation sensing optic system. In the rotation sensing optic system, the light from the SLD is split and used to create counter-propagating light beams which propagate within a fiber optic sensing coil. A phase shift between the counter-propagating waves develops as a result of a physical rotation of the fiber optic sensing coil, corresponding to the rotation of the FOG. The counter propagating light beams are directed by the first directional coupler to a photodetector, where the intensity of the light beams (resulting from the interference between the two beams) is measured to determine the angular speed of the FOG rotation. The angular speed of the FOG rotation is related to the phase information provided by the light in the sensing coil through a term referred to herein as "scale factor." The scale factor describes the sensitivity of the FOG by relating an amount of phase change between the two light beams to a FOG rotation angular speed. The scale factor is linearly related to the "effective interferometric wavelength" of the SLD's light, which is a weighted average of the SLD light's spectrum.

Practical applications of the FOG drive the need for a scale factor that remains stable across ranges of various environmental conditions. Various phenomena, however, can affect the effective interferometric wavelength, thereby affecting the scale factor. For example, SLDs generally suffer from poor wavelength stability with respect to temperature (typically 30~400 ppm/° C.), and with respect to drive current (typically 10~40 ppm/mA). Optic feedback may also affect the effective interferometric wavelength by either changing the spectral shape or adding spectral ripples. Further, the individual optic components of a FOG may modify the shape of the SLD light spectrum. These optic components can act as spectral filters to the SLD broadband light and change the effective interferometric wavelength of the light transmitted through them. The mechanisms of the filtering can be different, such as a mode field difference between the light source and a PM fiber, a limited bandwidth at a fiber to PIC waveguide connection, a spectral dependence of the split ratio of the directional coupler, or a limited spectral bandwidth of the transmission of a polarizer.

The optic components may also suffer from the potential wavelength changes with aging and/or environmental conditions. When the light source and the optic circuit are exposed to harsh environments, the changes in the optic spectrum may be accelerated, resulting in a large scale factor error. Different wavelengths in the broadband spectrum of the light source can experience different levels of attenuation due to the aging of the components in the optic circuit of the FOG. Such components may include, but are not limited to, polarizers, couplers, and connection joints between optic fibers and an integrated waveguide. Variations in one or more of these components may shift the effective interferometric wavelength, and thereby change the scale factor. For FOGs being used in applications that require a high degree of accuracy, these variations may create an unacceptable level of error. There is a need for stabilization of the scale factor of a broadband fiber source used in fiber optic gyros, especially when exposed to radiation and other external influences.

SUMMARY

The described embodiments generally relate to fiber optic gyroscope (FOG), and specially described embodiments pertain to the measurement of the effective interferometric wavelength (EIW) of the optic spectrum of a broadband light source of a FOG. The described embodiments provide an apparatus based on a photonic integrated circuit (PIC) for the EIW.

Today, most FOGs are operated at a wavelength that falls within a range of approximately 830 nm to 1550 nm. In order for the scale factor error of the FOG to be held within 100 ppm, the effective interferometric wavelength needs to have an accuracy of 0.083 nm for 830 nm and 0.155 nm for 1550 nm, which is considerably small in comparison to the 15~50 nm spectral bandwidth.

A FOG responds to rotation with a slightly different scale factor value for different wavelengths in the spectrum of the FOG light source. The measurement of the angular speed of rotation is a weighted average of the response of all incremental portions of the FOG light source spectrum. The overall scale factor is dependent on not only the mean wavelength but also the shape of the spectrum, such as the spectral symmetricity and the fine spectrum structures. The most common fine spectrum structure is spectrum ripples. The ripple is a result of a residual cavity oscillation, if the anti-reflection coating is imperfect. FIG. 1A shows a typical spectrum of a SLD with its front facet coated with an anti-reflection coating, and with the waveguide at the back end micro-fabricated into an anti-reflection shape. SLD temperature, drive current to the SLD, and SLD aging may change characteristics of the ripple. The residual cavity oscillation is also responsible for the residual laser structure in the coherence function of the broadband source.

According to the described embodiments, the scale factor is linearly related to the centroid wavenumber of the FOG broadband light source, when the FOG is operated at or near its most linear phase bias position. The wavemeter system and the measurement method of the described embodiments are devised to measure the same effective interferometric wavelength that is used for rotation sensing, as described herein. The signal detection and amplification techniques for the wavemeter of the described embodiments may achieve robust measurements, even when the broadband light source experiences ionizing radiation and other harsh environmental conditions.

Aspects of the described embodiments may be utilized in conjunction with a conventional FOG, to produce a "corrected" FOG, which exhibits a more stable scaling factor than that of the conventional FOG alone.

In one aspect, the invention may be an optic wavemeter for measuring an optic wavelength. The optic wavemeter may comprise a first optic waveguide to guide at least a portion of an optic signal, derived from broadband light, for an interaction length, and to produce a first processed optic signal. The optic wavemeter may further comprise a second optic waveguide, a segment of which is arranged in close proximity to the first optic waveguide. The segment may extend along an interaction length, such that the second optic waveguide receives a portion of the optic signal from first optic waveguide through evanescent coupling along the interaction length, and produces a second processed optic signal. The optic wavemeter may further comprise a wavemeter detector to measure an effective interferometric wavelength of the broadband light, based on the first processed optical signal and second processed optic signal.

In another aspect, the invention may be a system for stabilizing a scale factor associated with an optic rotation sensor. The optic rotation sensor may comprise a light source to emit broadband light, and a rotation sensing optic system to generate an optic signal. The optic signal may be derived from the broadband light and generated in response to a rotation of the optic rotation sensor. The optic rotation sensor may further include a sensor detection system to produce a rotation measurement signal as a function of the optic signal and rotation of the optic rotation sensor. The system may further comprise a wavemeter coupled to the optic rotation sensor. The wavemeter may comprise a first optic waveguide to guide at least a portion of one of the optic signal and the broadband light for an interaction length, and to produce a first processed optic signal. The wavemeter may further comprise a second optic waveguide, a segment of which is arranged in close proximity to the first optic waveguide. The segment may extend along an interaction length, such that the second optic waveguide receives a portion of the optic signal from first optic waveguide through evanescent coupling along the interaction length, and produces a second processed optic signal. The wavemeter may further comprise a wavemeter detector to measure an effective interferometric wavelength of the broadband light based on the first processed optical signal and second processed optic signal. The system may further comprise a scale factor correction system to generate a corrected rotation measurement signal based on the rotation measurement signal and the effective interferometric wavelength.

In an embodiment, a phase difference of supermodes of the first optic waveguide and the second optic waveguide, at the effective interferometric wavelength of the broadband light source, is equal to the phase modulation for the optic rotation sensor. The phase modulation for the optic rotation sensor may be substantially equal to $\pi/2$.

The wavemeter detector may be configured to measure the effective interferometric wavelength of the broadband light by using a fringe visibility v, where $$v = \frac{(p_-) - (p_+)}{(p_-) + (p_+)}.$$

The wavemeter detector may be configured to measure the effective interferometric wavelength of the broadband light based on the first processed optic signal. The wavemeter detector may be configured to measure the effective interferometric wavelength of the broadband light based on the second processed optic signal. The wavemeter may be connected to the optic rotation sensor to receive at least a portion of the optic signal from an optic path between the rotation sensing optic system and the sensor detection system. A 2×2 waveguide directional coupler may be utilized to couple at least a portion of the optic signal from the optic rotation sensor to the wavemeter. A multimode interference coupler may be utilized to couple at least a portion of the optic signal from the optic rotation sensor to the wavemeter.

In an embodiment, the wavemeter may be connected to the optic rotation sensor to receive at least a portion of the broadband light from an optic path between the broadband light source and the rotation sensing optic system. A 2×2 waveguide directional coupler may be utilized to couple at least a portion of the optic signal from the optic rotation sensor to the wavemeter. A multimode interference coupler may be utilized to couple at least a portion of the optic signal from the optic rotation sensor to the wavemeter.

The first optic waveguide and the second optic waveguide may comprise one or more Si-CMOS compatible materials, and the first and second optic waveguides are fabricated using one or more Si-CMOS compatible processes. The first and second optic waveguides may be made of silicon nitride as the waveguide core, and silicon oxide as the waveguide cladding material.

The wavemeter detector may comprise a first photodiode configured to receive the first processed optic signal, a first transimpedance amplifier to convert a first current from the first photodiode into a first voltage and deliver the first voltage to an effective interferometric wavelength measurement unit, a second photodiode configured to receive the second processed optic signal, and a second transimpedance amplifier to convert a second current from the second photodiode into a second voltage and deliver the second voltage to the effective interferometric wavelength measurement unit.

The wavemeter detector may comprise a symmetric dual-element photodiode configured to receive the first processed optic signal and the second processed optic signal. The wavemeter detector may further comprise a first transimpedance amplifier to convert a first current from a first element of the dual-element photodiode into a first voltage and deliver the first voltage to an effective interferometric wavelength measurement unit. The wavemeter detector may further comprise a second transimpedance amplifier to convert a second current from a second element of the dual-element photodiode into a second voltage and deliver the second voltage to the effective interferometric wavelength measurement unit.

The wavemeter detector may comprise a symmetric dual-element photodiode configured to receive the first processed optic signal and the second processed optic signal, and an electronic switch configured to selectively couple a first input and a second input to an output. The first input may be coupled to a first element of the symmetric dual-element photodiode, the second input coupled to a second element of the symmetric dual-element photodiode, and the output coupled to a transimpedance amplifier. The electronic switch may be further configured to selectively couple the first and second inputs to the output with a predetermined frequency. The transimpedance amplifier may be configured to convert a current from the output into a voltage, and to deliver the voltage to an effective interferometric wavelength measurement unit.

In an embodiment, the wavemeter detector may comprise an optic switch configured to alternatively guide, with a predetermined frequency, the first processed optic signal and the second processed optic signal to a photodiode. The wavemeter detector may further comprise a transimpedance amplifier configured to convert a current from the photodiode into a voltage, and deliver the voltage to an effective interferometric wavelength measurement unit.

In another aspect, the invention may be a method of stabilizing a scale factor associated with an optic rotation sensor, comprising providing broadband light from a broadband spectral light source, processing the broadband light in an optic rotation sensor to generate an optic signal in response to an angular speed of the optic rotation sensor, and passing the optic signal to a sensor detection system configured to produce a rotation measurement signal based on the optic signal. The rotation measurement signal may characterize the angular speed of the optic rotation sensor in accordance with a default interferometric wavelength. The method may further comprise directing at least a portion of the broadband light to a wavemeter, measuring, by the wavemeter, an effective interferometric wavelength based on the broadband light directed to the wavemeter, and correcting the rotation measurement signal in accordance with the effective interferometric wavelength.

In another aspect, the invention may be a system for stabilizing a scale factor associated with a fiber optic gyroscope (FOG), comprising an optic rotation sensor configured to produce a rotation measurement signal as a function of a rotation of the FOG, and a wavemeter coupled to the optic rotation sensor. The wavemeter may comprise a first optic waveguide to guide at least a portion of broadband light from the optic rotation sensor for an interaction length, and to produce a first processed optic signal, and a second optic waveguide. A segment of the second optic waveguide may be arranged in close proximity to the first optic waveguide, the segment extending along an interaction length, such that the second optic waveguide receives a portion of the optic signal from first optic waveguide through evanescent coupling along the interaction length, and produces a second processed optic signal. The wavemeter may further comprise a wavemeter detector to measure an effective interferometric wavelength of the broadband light based on the first processed optic signal and the second processed optic signal, and a scale factor correction system to generate a corrected rotation measurement signal based on the rotation measurement signal and the effective interferometric wavelength.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1A:
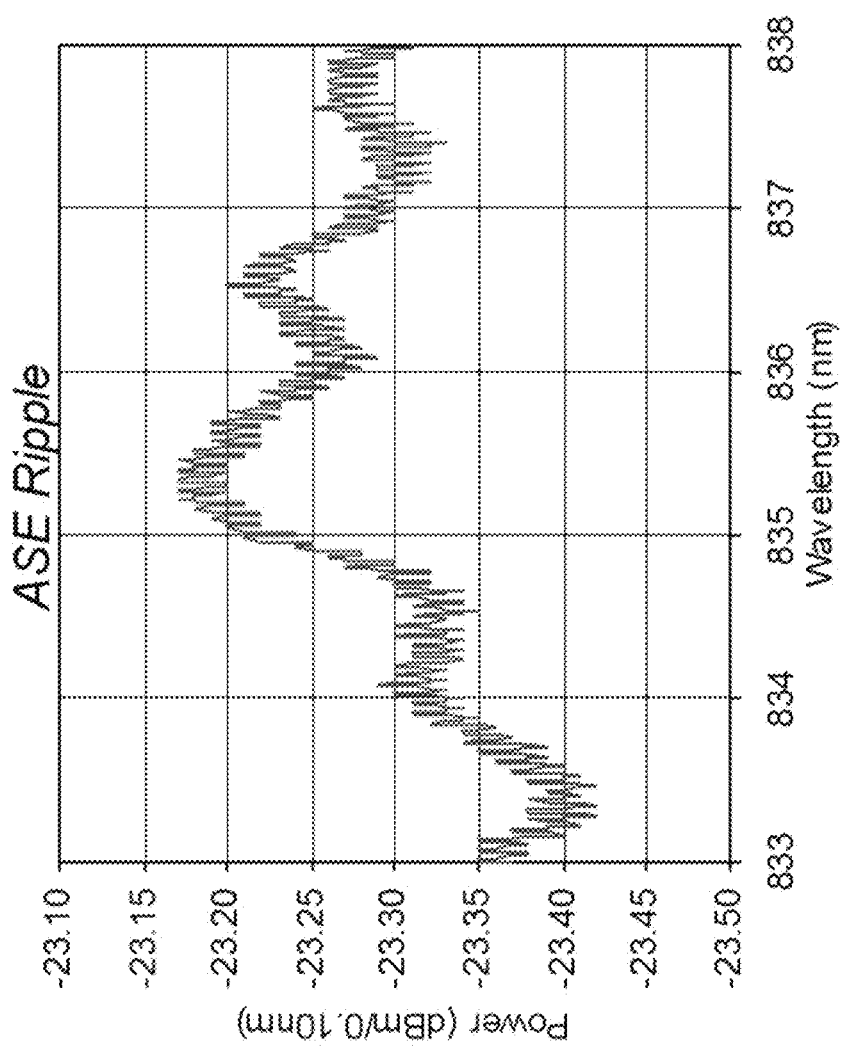
FIG. 1A shows a typical spectrum of a SLD with its front facet coated with anti-reflection coating, and with the waveguide at the back end micro-fabricated into an anti-reflection shape.

A description of example embodiments follows.

The teachings of all patents, published applications and references cited herein are incorporated by reference in their entirety.

In an example embodiment of a fiber optic gyroscope (FOG), beam splitting optics launch light from a superluminescent device into two light beams of equal power, P, propagating in the clockwise and anticlockwise directions through a coil consisting of many turns of optic fiber. This arrangement forms a ring interferometer, also known as a Sagnac interferometer. Upon returning to the entry point of the optic fiber coil, the two light beams are allowed to exit the optic fiber coil and undergo interference.

If the broadband light emitted from the superluminescent device has a spectral distribution given by P(k), where $k=1/\lambda$ is the wavenumber, and if the light at different wavenumbers, k, is incoherent, i.e., has a random phase difference, then the total transmitted optic power through the ring interferometer can be found by adding powers for different k $$P(\delta) = \int_0^\infty P(k)(1 + \gamma_c \cos(2\pi k \delta))dk \tag{1}$$

where $\lambda=1/k$ is the light wavelength, $\gamma_c$ is the coherent function of the source, and $\delta$ is the optic path difference between the two counter-propagating waves in the ring interferometer. To within a constant, the right-hand side of equation (1) is the cosine form of the Fourier transform of P(k); $P(\delta)=\{F(P(k)\}$.

On the other hand, an effective interferometric wavelength, $\lambda_{int}$, is defined as a wavelength of light that would make the ring interferometer respond exactly the same as the broadband light source. The corresponding interferometric wavenumber (also referred to as the centroid wavenumber) is $k_{int}=1/\lambda_{int}$. The total transmitted signal through the ring interferometer can be expressed as $$P(\delta) = (1 + \gamma_c \cos(2\pi k_{int}\delta)) \int_0^\infty P(k)dk \quad (2)$$

Since equations (1) and (2) express the same signal, they can be rewritten as $$\cos(2\pi k_{int}\delta) = \frac{\int_0^\infty P(k)\cos(2\pi k\delta)dk}{\int_0^\infty P(k)dk} \quad (3)$$

Equation (3) is a general formula to determine the interferometric wavenumber of the light source in a ring interferometer. The optic path difference, $\delta$, is a parameter that determines the value of interferometric wavenumber $k_{int}$. The optic path difference, which is equivalent to the optic phase difference, can be produced by a Sagnac effect or by phase modulation. Thus, in an example embodiment, a phase modulator may generate the optic path difference, $\delta_m$, such that $2\pi k_{int}\delta_m=\pi/2$, so the interferometer works at its most linear point $2\pi k\delta=\pi/2+\Delta\varphi_s$, where $\Delta\varphi_s$ is the Sagnac phase shift (i.e., Sagnac effect). If $\Delta\varphi_s$ is small, $\sin(2\pi k\Delta\varphi_s)\approx 2\pi k\Delta\varphi_s$. Eq. (3) becomes $$k_{int} = \frac{\int_0^\infty kP(k)dk}{\int_0^\infty P(k)dk} \quad (4)$$

which is independent of the phase shift $\Delta\varphi_s$. Therefore, according to equation (4), it is the centroid wavenumber $k_{int}$ that represents the broadband light to determine the scale factor of a rotation sensor. Converting equation (4) into wavelength domain, the effective interferometric wavelength is $$\lambda_{int} = \frac{\int_0^\infty P(\lambda)d\lambda}{\int_0^\lambda P(\lambda)/\lambda d\lambda} \quad (5)$$

Prior scale factor stabilization techniques may be based on the measurement of either discrete windows of the optic spectrum or the centroid wavelength of the broadband light source. These prior techniques may introduce certain systematic errors in the corrected scale factors. By contrast, the example embodiments described herein measure the centroid wavenumber $k_{int}$.

Figure 1B:
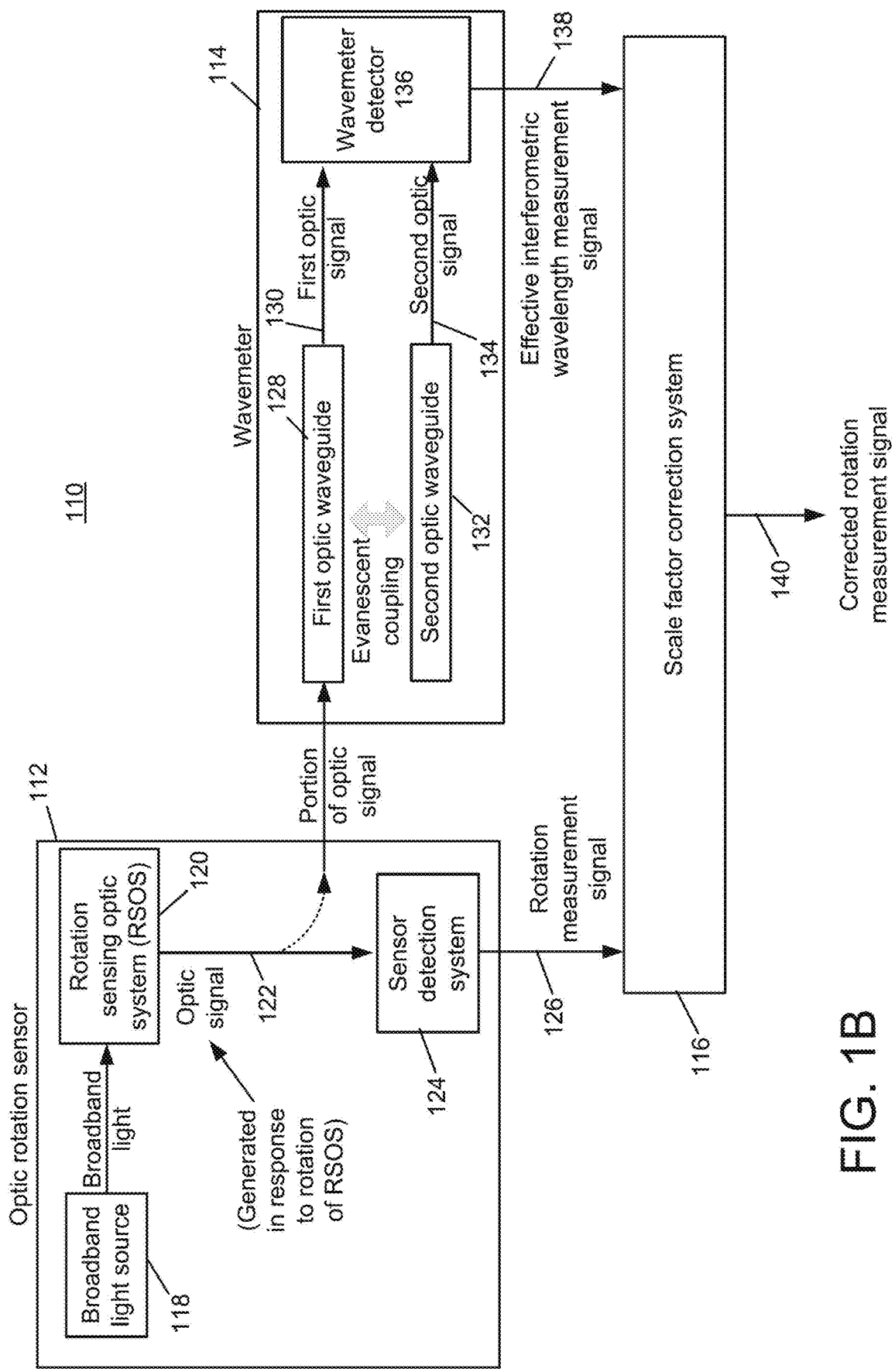
FIG. 1B illustrates an example embodiment of a FOG system with scale factor stabilization 110 according to the invention.

FIG. 1B illustrates an example embodiment of a FOG system with scale factor stabilization 110 according to the invention. The embodiment comprises an optic rotation sensor 112, a wavemeter 114 and a scale factor correction system 116. The optic rotation sensor 112 comprises a broadband light source 118, which provides broadband light to a rotation sensing optic system 120. The rotation sensing optic system 120 facilitates counter-propagating light beams within a fiber optic sensing coil, and produces an optic signal 122 based on an interaction of the counter-propagating light beams once they have exited the fiber optic sensing coil. A sensor detection system 124 receives the optic signal 122, and produces a rotation measurement signal 126 as a function of the optic signal 122.

An example sensor detection system 124 may comprise electronic circuits that supply a voltage modulating signal to an optical phase modulator, a transimpedance amplifier to convert the optic signal to electric signal, an analog-to-digital (A/D) convertor, and a microprocessor-based controller. An electric signal (e.g., a square-wave or sine-wave signal) may be applied to the phase modulator to generate an optic path difference between the two counter-propagating lights. The microprocessor controller may control the frequency and the amplitude of the electric signal such that the optical signal at the photodetector responds linearly and sensitively to a phase shift produced by the Sagnac effect, and the frequency is maintained at a predetermined frequency, which is preferably equal to the eigenfrequency of the optic system. An eigen-frequency has a period equal to twice the difference between the times taken by the counter-propagating beams to propagate from the beam splitter to the phase modulator. The microprocessor controller synchronizes the detected optic signal with the modulating electric signal and converts the detected signal into the Sagnac phase shift, $\Delta\varphi_s$, using a suitable demodulation method and corresponding calibration coefficients.

At least a portion of the optic signal 122 is also received by the wavemeter 114, where the portion of the optic signal 122 is inserted into a first optic waveguide 128. The portion of the optic signal 122 passes through and exits the first optic waveguide 128 as a first optic signal 130. Evanescent coupling between the first optic waveguide 128 causes a coupled optic signal to propagate in and exit a second optic waveguide 132 as a second optic signal 134. A wavemeter detector 136 generates an effective interferometric wavelength measurement signal 138 as a function of the first optic signal 130 and the second optic signal 134.

Structures of the example embodiments of the wavemeter detector 136 are explained in FIGS. 5 through 8. Examples of a wavemeter detector 136 may comprise photodetectors (502 or 603 or 704), transimpedance amplifiers (504 or 604 or 706), an electronic switch (702) for the example embodiment of FIG. 7, an optic switch (802) for the example embodiment of FIG. 8, and an effective interferometric wavelength measurement unit 506. The effective interferometric wavelength measurement unit 506 comprises one or more electronic filters, an A/D convertor, and a second microprocessor-based controller. The filters may comprise a narrowband pass filter and a moving averaging filter. The narrowband pass filter can be centered at the fundamental frequency or the second harmonic frequency of the voltage modulating signal with a predetermined pass band of frequency. The moving average filter can have a predetermined number of points in an averaging window. The second microprocessor-based controller determines the fringe visibility, v, defined by Eq. (14) herein, and converts the fringe visibility into the effective interferometric wavelength using one or more calibration coefficients. One example embodiment of the filters may be a lock-in amplifier. Another example embodiment of the filters may be digital filters implemented in the second microprocessor-based controller.

The scale factor correction system 116 applies a correction to the rotation measurement signal 126, based on the effective interferometric wavelength measurement signal 138, to produce a corrected rotation measurement signal 140. The Scale factor correction system, 116, adjusts a scale factor of the gyroscope to improve the accuracy of the sensor output using the Sagnac phase shift measured with the Sensor detection system (124) and the accurately-determined value of the effective interferometric wavelength measured with the Wavemeter detector (136), respectively.

In a conventional FOG, the scale factor (F) relationship between the observed phase shift produced by the Sagnac effect ($\Delta\varphi_s$) and the angular speed ($\Omega$) is known to be represented by the relationship: $\Delta\varphi_s = F\Omega = 2\pi/c \cdot LDk\Omega$, wherein L is the length of optical fiber in the fiber coil, D is the diameter of the coil, c is the speed of light and k is wavenumbers of the light. During the calibration process, the FOG device can be mounted on a rate table which has a known rate of rotation, $\Omega_{tab}$. Both the calibrated Sagnac phase shift, $\Delta\varphi_{cal}$, and the calibrated wavenumber, $k_{cal}$, are measured with Sensor detection system (124) and with the Wavemeter detector (136) respectively, and delivered to the Scale factor correction system (116). The calibrated scale factor is then calculated as, $F_{cal} = 2\pi/c \cdot LDk_{op} = \Delta\varphi_{cal}/\Omega_{tab}$. During a regular operation conditions where the effective interferometric wavelength can be different from that during the calibration process due to the environmental or/and aging effects, the Sagnac phase shift, and the wavenumber measured with the Sensor detection system (124) and from the Wavemeter detector (136) are $\Delta\varphi_{op}$ and $k_{op}$, respectively. The corrected scale factor is $F_{corr} = F_{cal} \cdot k_{op}/k_{cal}$, and the corrected angular speed is $\Omega_{corr} = F_{corr} \cdot \Delta\varphi_{op}$. These calibration-operation processes on the scale factor correction can be implemented in a third microprocessor controller.

Although conceptually each of the three subsystems has an individual microprocessor-based controller for controlling and data processing, the three microprocessor-based controllers can be merged into one central microprocessor in practice.

Figure 1C:
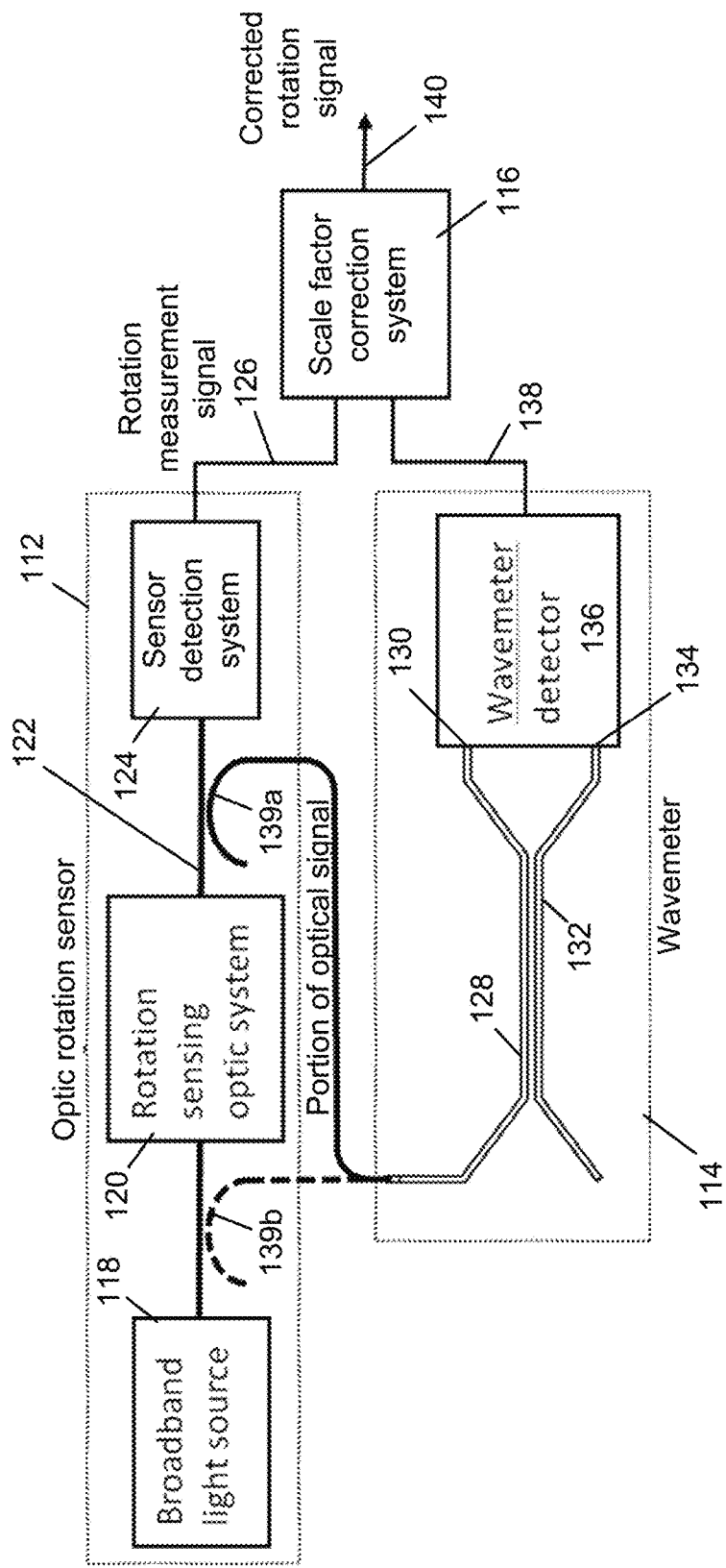
FIG. 1C shows an alternative example embodiment of the FOG system with scale factor stabilization 110 shown in FIG. 1B.

FIG. 1C shows an alternative example embodiment of the FOG system with scale factor stabilization 110 shown in FIG. 1B. As will be described herein, the portion of the optic signal provided to the wavemeter 114 may be coupled from the output of the rotation sensing optic system 120 (shown by coupler 139a) or from the output of the broadband light source 118 (shown by coupler 139b).

Wavemeter Based on Directional Coupler

Figure 2:
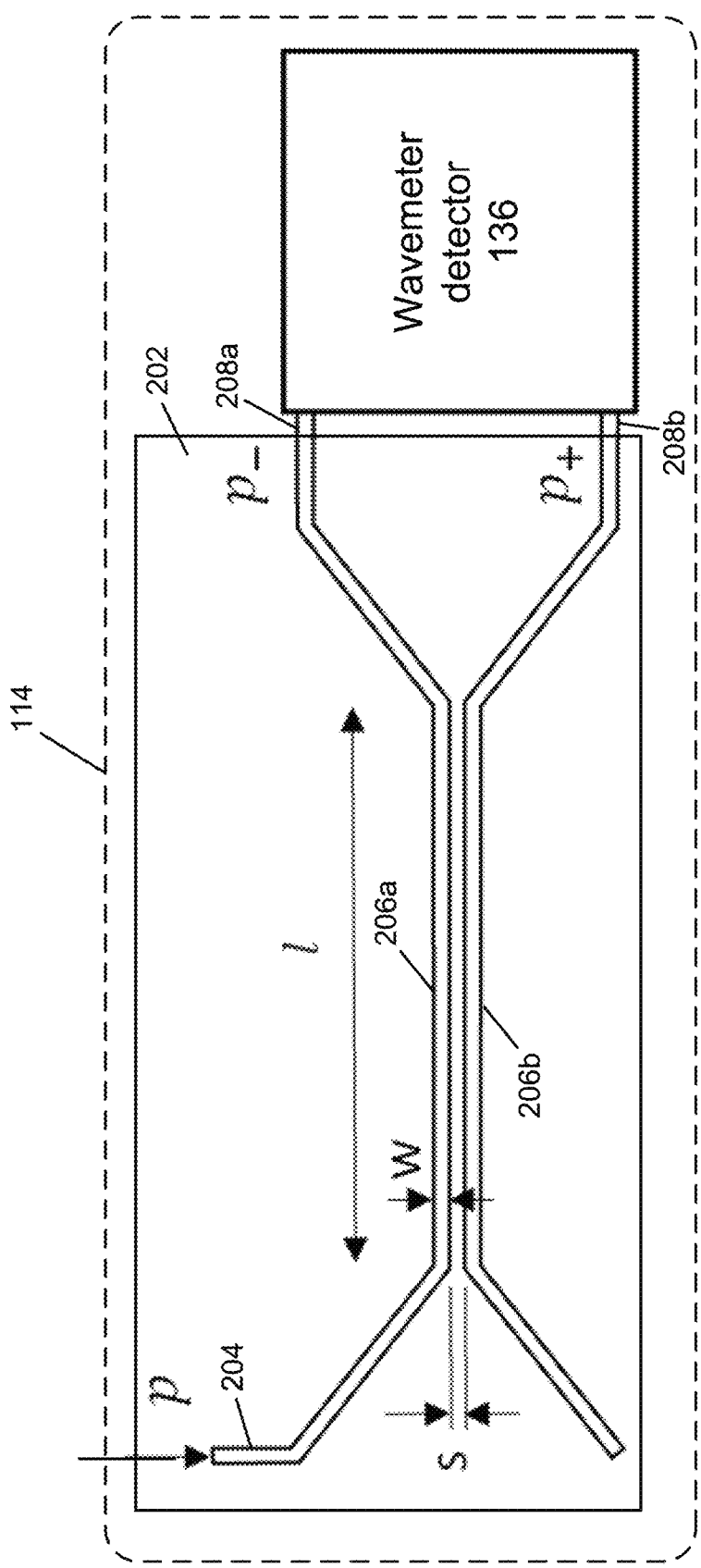
FIG. 2 shows an example embodiment of a wavemeter according to the invention.

An example embodiment of a wavemeter 114, corresponding to the wavemeter 114 shown in FIGS. 1B and 1C, is shown in FIG. 2. The wavemeter 114 measures the same centroid wavenumber required by either equation (3) or equation (4), described herein, for scale factor stabilization of a FOG.

The example wavemeter 114 comprises an optic measurement unit and components necessary to convert the optic wavelength information to electric output. The optic measurement unit is based on a symmetric 2×2 (2 input and 2 output) directional coupler 202, comprising an input waveguide 204, two input S-bends at the first transition region, a pair of straight waveguides 206a, 206b, as the coupling region, two output S-bends as the second transition region, and two output waveguides 208a, 208b, as illustrated in FIG. 2. Although the configuration of the 2×2 directional coupler shown in FIG. 2 is presented as an example embodiment, it should be understood that other configurations of a directional coupler may alternatively be used in other embodiments.

The two straight waveguides 206a, 206b in the coupling region are arranged in close proximity to one another, as is described in more detail below, to form a directional coupler, such that the input signal in the first waveguide transfers part of its power into the second waveguide through evanescent coupling. The amount of the optic power transferred from the input signal in the first waveguide into the second waveguide varies in accordance to the effective interferometric wavelength of the input broadband light, as will be further explained herein.

The directional coupler 202, as part of a wavelength sensing unit, is characterized by the set of parameters w, s and l. The parameter w represents the waveguide width, constant over the whole coupling region. The parameter s represents the separation between the two waveguides at the coupling region. The parameter l represents the length of the straight waveguides in the coupling region. The power exchange between the waveguides not only takes place in the coupling region, but also in parts of the transition regions where the two waveguides become closer together. Hence, a directional coupler with coupling length l and transition regions is considered to be equivalent to an ideal directional coupler with two parallel optic waveguides of an effective coupling length l', such that the effective coupling length l' is dependent on the actual coupling length l, along with the size and geometry of the transition regions.

If light with power p is coupled into the input waveguide, as shown in FIG. 2, the light powers at the outputs of the through and cross-coupled waveguides are $$p_- = p(k)[1 + \gamma_c \cos(2\pi k l \Delta n_e)] \quad (6)$$

$$p_+ = p(k)[1 - \gamma_c \cos(2\pi k l \Delta n_e)] \quad (7)$$

where $\Delta n_e$ is the difference of the effective refractive indexes for the symmetric and the anti-symmetric supermodes of the composite waveguide structure, and can be regarded as a constant in the wavelength range of interest.

The measured broadband light is coupled from the FOG optic rotation sensor 112, and thus has the identical spectrum as the source 118 of FOG, so the light at different wavenumbers, k, is incoherent. The total output of through waveguide is the sum of the power for different k.

$$p_-(\delta_k) = \int_0^\infty p(k)[1 + \gamma_c \cos(2\pi k \delta_k)] dk \quad (8)$$

where $\delta_k = l\Delta n_e$ is the effective optic path difference between the two supermodes after propagating through the coupling region. To within a constant, the right-hand side of Eq. (8) is the cosine form of the Fourier transform of p(k); $p(\delta_k) = F\{p(k)\}$.

The output signal of cross-coupled waveguides 206a, 206b takes a similar form;

$$p_+(\delta_k) = \int_0^\infty p(k)[1 - \gamma_c \cos(2\pi k \delta_k)] dk \quad (9)$$

On the other hand, the wavelength that is measured by the wavemeter, $\lambda_{mea}$, is defined as an effective wavelength that would make the wavemeter respond exactly the same as the broadband width light source. This means that if we define a measured wavenumber as $k_{mea} = 1/\lambda_{mea}$, the output signals of the through and the cross-coupled waveguides also satisfy $$p_-(\delta_k) = [1 + \gamma_c \cos(2\pi k_{mea} \delta_k)] \int_0^\infty p(k) dk \quad (10)$$

$$p_+(\delta_k) = [1 - \gamma_c \cos(2\pi k_{mea} \delta_k)] \int_0^\infty p(k) dk \quad (11)$$

Since the right sides of Eqs. (8) and (10) are equal, and the right sides of Eqs. (9) and (11) are equal as well, both pairs of the equations result in Eq. (12)

$$\cos(2\pi k_{mea}\delta_k) = \frac{\int_0^\infty p(k)\cos(2\pi k\delta_k)dk}{\int_0^\infty p(k)dk} \quad (12)$$

Eq. (12) is a general formula for the measured wavenumber of the light source using the wavemeter 114. In a preferred embodiment, the length of the waveguides 206a, 206b in the coupling region, l, may be chosen to make the effective optic path difference, $\delta_e$, equal to the optic path difference, $\delta$, of the two counter-propagating waves in Equation (3), and the optic power coupled into the input waveguide, p(k), may be chosen to be proportional to P(k) in Eq. (3) for all the k values. Under these conditions, $k_{mea}$ is equal to $k_{int}$, which indicates that the wavemeter measures the same effective interferometric wavelength as being used for the rotation sensing. In an example embodiment, the length l of the straight waveguides 206a, 206b in the coupling region is chosen such that at a predetermined central wavenumber, $k_{ctr}$, that is related to a central wavelength, $\lambda_{ctr}$, by equation $k_{ctr}=1/\lambda_{ctr}$, the supermode phase difference $2\pi k_{ctr}\delta_e=\pi/2$. Therefore, the supermode phase difference at k can be expressed as $2\pi k\delta_e=\pi/2+2\pi k\theta_w$, where $\delta_w=(1-\lambda/\lambda_{ctr})\delta_e$ is a perturbation of supermode path difference value introduced by a different wavenumber k. Note that $\Delta\varphi_w=2\pi k\delta_w$ is equivalent to the Sagnac phase shift, $\Delta\varphi_s$, in the ring interferometer explained above. Assuming $\delta_w$ has a small value and an approximate equation $\sin(2\pi k\delta_w) \approx 2\pi k\delta_w$ holds. Similarly, an approximate equation $\sin(2\pi k_{mea}\delta_w) \approx 2\pi k_{mea}\delta_w$ also holds. If neglecting any higher order errors, insertion of the both approximate equations into Eq. (12) results in $$k_{mea} = \frac{\int_0^\infty kp(k)dk}{\int_0^\infty p(k)dk} \quad (13)$$

Comparing Eq. (13) with Eq. (4) shows that $k_{mea}$ is equal to $k_{int}$ if p(k) is proportional to P(k), such that P(k)=cp(k), where c is a constant for all k. This means that the spectrum of the light coupled into the wavemeter 114 for effective interferometric wavelength measurement is the same as the spectrum of light used for rotation sensing.

In an example embodiment, instead of detecting individual signals of through and cross-coupled waveguides, the signals of both waveguide channels may be detected and used to calculate a fringe visibility v, defined by Eq. (14), $$v = \frac{(p_-)-(p_+)}{(p_-)+(p_+)} \quad (14)$$

Inserting Eqs. (8) and (9), Eqs. (10) and (11) into Eq. (14), respectively, the expression of the measured wavenumber, $k_{mea}$, would be exactly the same as those of through waveguide signal $p_-$, expressed as Eqs. (12) and (13). Therefore, the centroid wavenumber measured by using the fringe visibility is the same centroid wavenumber of the light used for the measurement of the scale factor of the rotation sensor. Using the fringe visibility v, according to Eq. (14), for the centroid wavenumber measurement is more accurate than other techniques, since the fringe visibility is independent of the absolute value of the input power, p(k), and errors introduced by the detector bias and the transimpedance amplifier bias will be canceled.

Figure 3A:
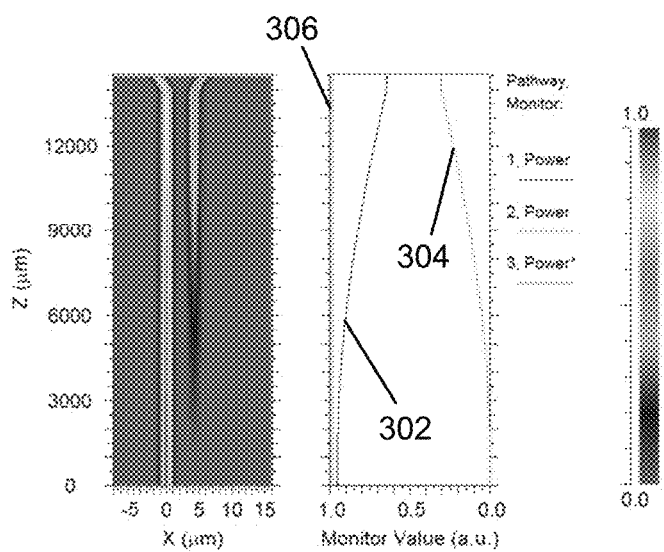
FIGS. 3A, 3B, and 3C illustrate the responses of an example wavemeter to three different wavelengths.
Figure 3B:
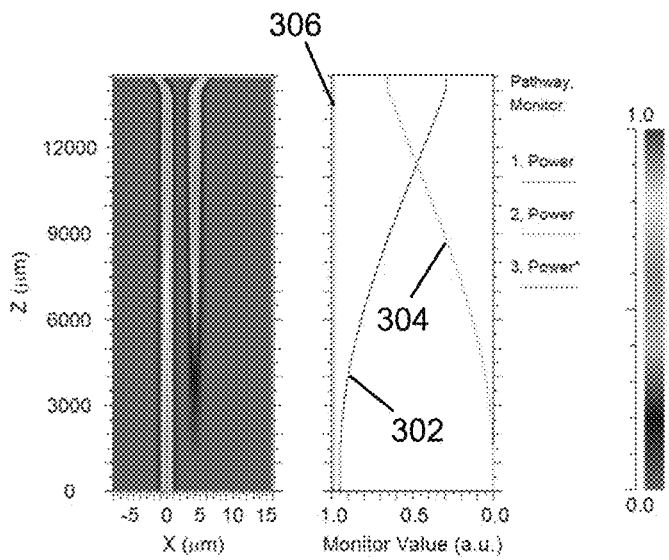
Figure 3C:
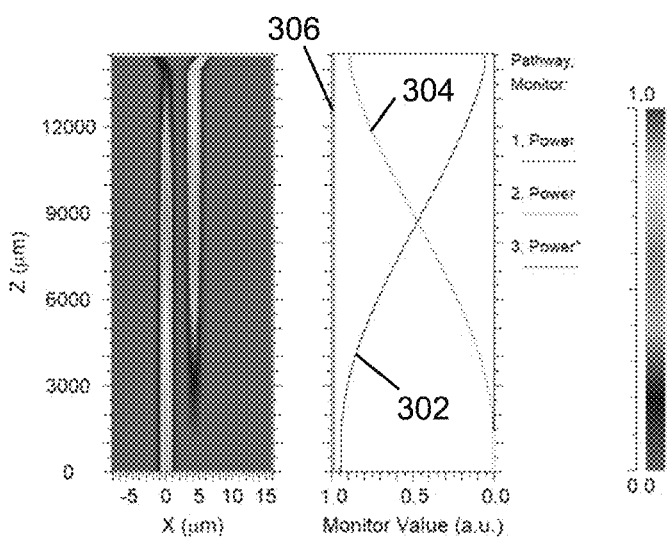
Figure 4:
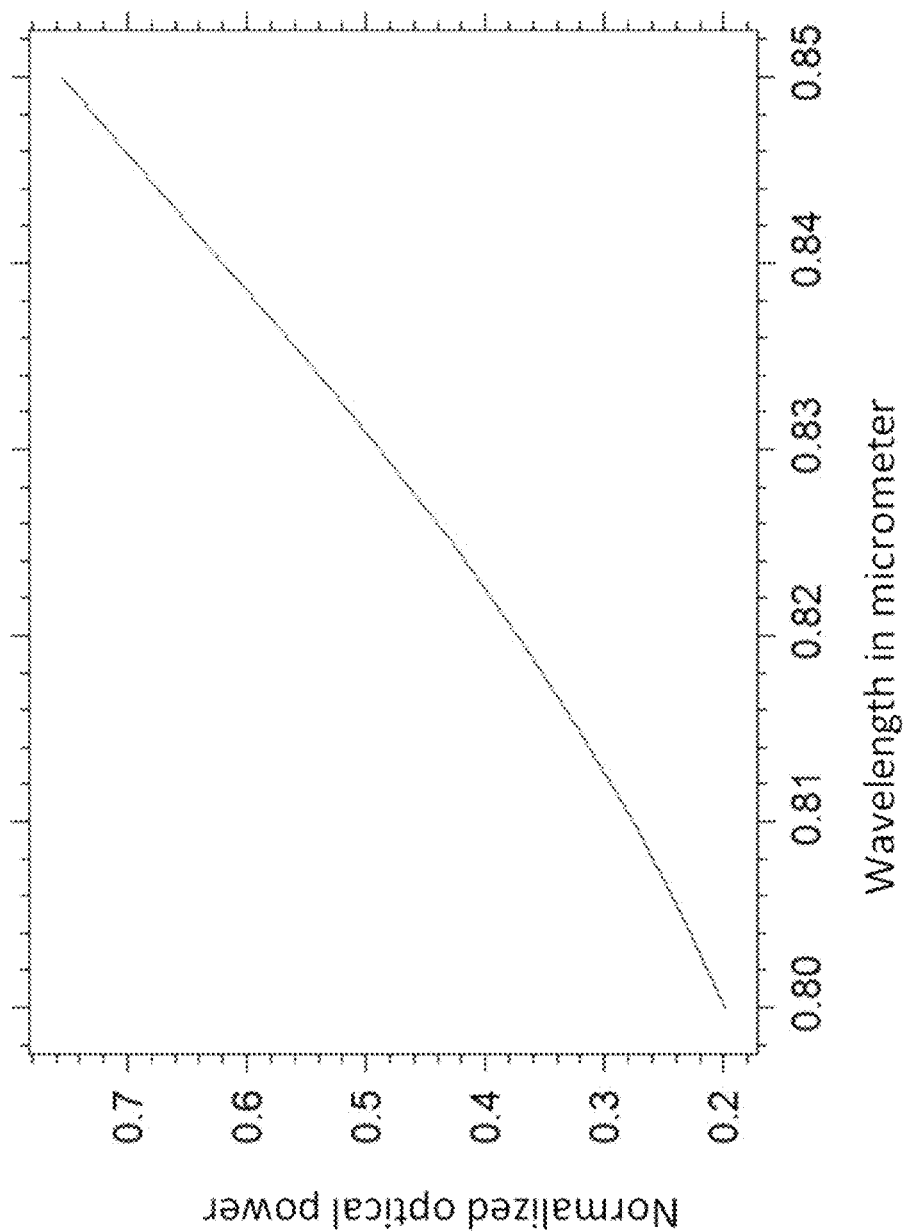
FIG. 4 shows the output optic power of the cross-coupled waveguide channel of an wavemeter according to the invention.

In an example embodiment, a wavemeter 114 may be fabricated for scale factor stabilization of a FOG operated at a wavelength near 830 nm. The effective interferometric wavelength of the FOG can vary in the range between 800 nm to 850 nm if the ambient temperature varies in the range of −50 to 90° C. In this example wavemeter embodiment, the directional coupler 202 may comprise waveguides of 50 nm thick and 4 micron wide silicon nitride waveguide core with silicon oxide as cladding materials. The parameters for the example directional coupler 200 are s=1.7 microns, and l=4 mm. Simulations on this embodiment results in the performances depicted in FIGS. 3A, 3B, 3C and 4. In FIGS. 3A, 3B, and 3C, the responses of the wavemeter 114 to three different wavelengths are displayed; FIG. 3A is at 800 nm, FIG. 3B is at 825 nm, and FIG. 3C is at 850 nm. The left plot in each figure is a top view of the normalized optic power distribution. The right plot in each figure is the normalized optic through power 302 in the through waveguide 206a and the normalized optic cross-coupled power 304 in the cross-coupled waveguide 206b. The sum of the optic powers 306 guided by the two waveguides is also shown in the plots on right which are straight line close to unity. The output optic power of the cross-coupled waveguide channel is therefore monotonically increasing with wavelength, as shown in FIG. 4. The wavelength sensitivity of the wavemeter in this embodiment is S=1.1% power change per nanometer of wavelength change.

In an example embodiment, one microwatt optic power may be coupled into the input waveguide of the wavemeter, 114, from the coupling point 139, (p=1 µW). The wavemeter is operated at the most sensitive and linear coupling distance where the supermode phase difference $2\pi k_{ctr}\delta_e=\pi/2$, then the output optic power from the through and cross-coupled waveguide is p/2=0.5 µW, respectively. The photodetector (502, 602, or 704) may have a responsivity η=0.60 A/W. The photocurrent of the detector, $i_{det}$, can be found as $i_{det}=\eta p/2$. The photocurrent noise at the quantum limit is related to the shot noise current $i_{shot}=\sqrt{2ei_{det}\Delta f_B}$, where e is the elementary charge, $i_{det}$ is photocurrent of the detector, and $\Delta f_B$ is the detection bandwidth. The wavelength sensitivity of the wavemeter is expressed as S=$(\Delta i_{det}/i_{det})/\Delta\lambda$, where $\Delta i_{det}$ is the photocurrent change of the detector when wavelength changes $\Delta\lambda$. The noise equivalent wavelength density (NEWD) is defined as NEWD=$(i_{shot}/i_{det})/(\sqrt{2\Delta f_B}S)$. Insertion of $i_{shot}$, $i_{det}$ and S values results in NEWD=0.066 pm/$\sqrt{Hz}$. In the practical operation, the sampling rate may be 1 Hz, the noise equivalent wavelength (NEW) is NEW=6.6× $10^{-5}$ nm, which is equivalent to ~0.2 ppm scale factor error at 830 nm for a dual detection scheme. Therefore, the 0.083 nm wavelength accuracy needed for the 100 ppm scale factor error at 830 nm wavelength can be well satisfied. Averaging the signal for a longer time will result in even better NEW value.

The input signal of the wavemeter 114 can be a portion of the broadband source 118 which can be coupled from the propagation path delivered from the broadband source 118 to the rotation sensing optic system 120 (see, for example, the multimode interference coupler 139b of FIG. 1C).

In an alternative embodiment, the input signal for the wavemeter 114 may be a portion of the transmitted signal from the rotation sensing optic system 120 and can be coupled from the propagation path leading to the sensor detection system (which includes the photodetector). See, for example, the multimode interference coupler 139a in FIG. 1C. In this way, spectrum alteration made by the filtering effect of the components of the rotation sensing optic system 120 is included in the effective interferometric wavelength.

In one embodiment, an optic fiber may guide the return gyro signal to the FOG photodetector, an additional fiber optic coupler may be positioned into the fiber that leads to the detector and couple a portion of the return gyro signal from the main FOG signal. The portion of the return gyro signal may then be delivered to the through waveguide of the wavemeter 114 as an input signal.

In another embodiment, the rotation sensing optic system 120 of a FOG may be a component of an integrated optic circuit (IOC). A directional coupler may be positioned in the waveguide that guides the return gyro signal to a photodetector for the rotation measurement, and direct a portion of return gyro signal into the first waveguide of the wavemeter 114 as an input to the wavemeter 114. In this embodiment, an additional subsystem of the IOC, comprising a directional coupler and the wavemeter 114, may be micro-fabricated together with the rotation sensing optic system 120 as part of the FOG IOC.

Signal Detection and Amplification Schemes

Since the wavelength is measured with the fringe visibility using the two output signals of the wavemeter, the stability and the repeatability of each signal, and the balance between the two signals over temperature and time, are directly related to the accuracy and the stability of the wavelength measurement. This requires that both the waveguides of the wavemeter 114 are stable and balanced, that the coupling between the two waveguides is repeatable, that both the two photodetectors response identically with temperature and time, and that the coefficients of the two transimpedance amplifiers varying identically with temperature and time. Several embodiments are provided in this invention to minimize the measurement errors induced by the environment and aging.

Figure 5:
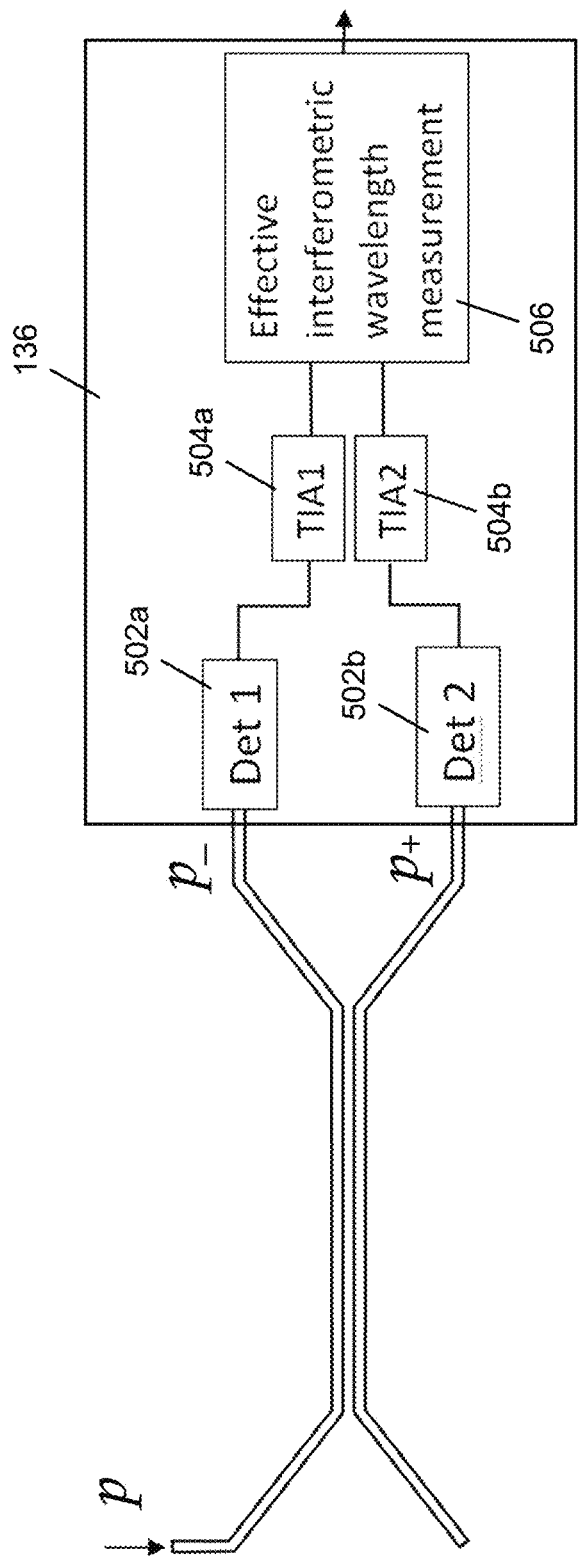
FIG. 5 shows an example embodiment of a wavemeter detector according to the invention.

In one embodiment, two identical photodetectors 502a, 502b, and two identical transimpedance amplifiers (TIA) 504a, 504b, may be used within the wavemeter detector 136, as shown in FIG. 5.

Figure 6:
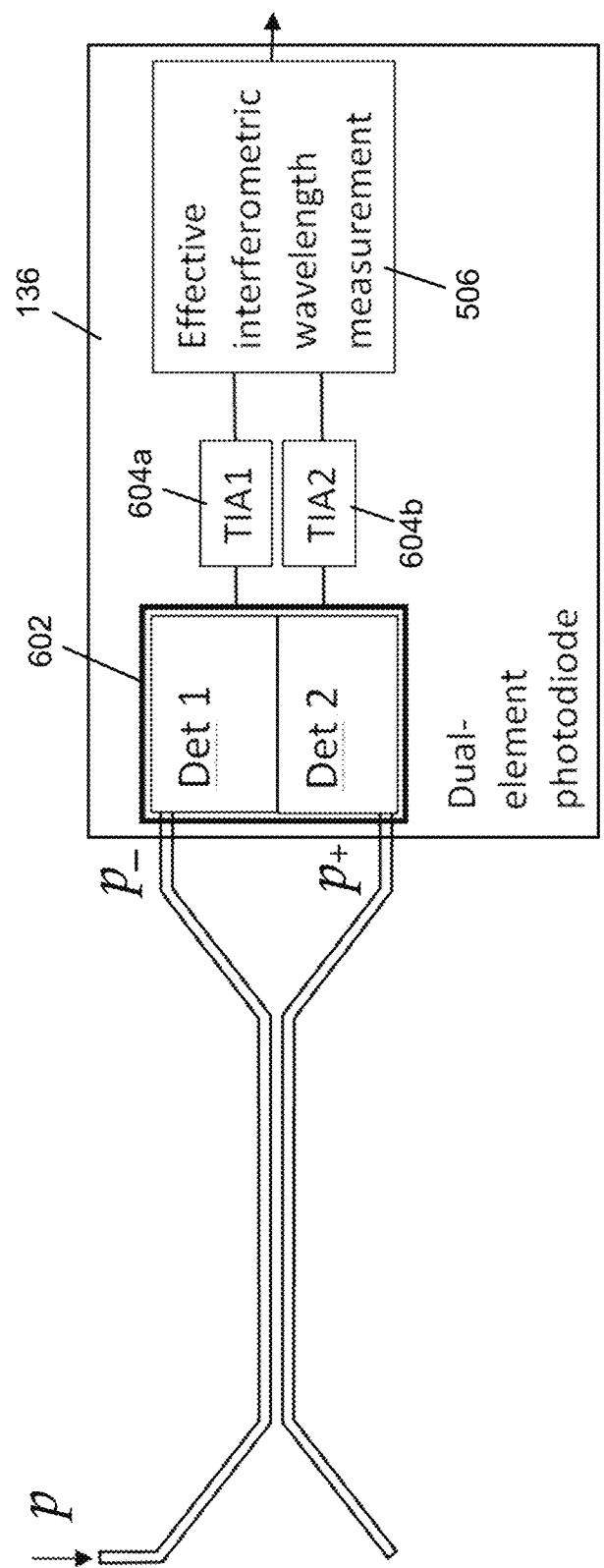
FIG. 6 shows another example embodiment of a wavemeter detector according to the invention.

In another embodiment, a dual photodiode 602 may be used within the wavemeter detector 136, as shown in FIG. 6. A dual photodiode 602 comprises two photodiodes that are fabricated with identical processes on the same substrate next to each other. A signal from each of the photodiodes may be pre-amplified using a pair of identical TIAs 604a, 604b.

Figure 7:
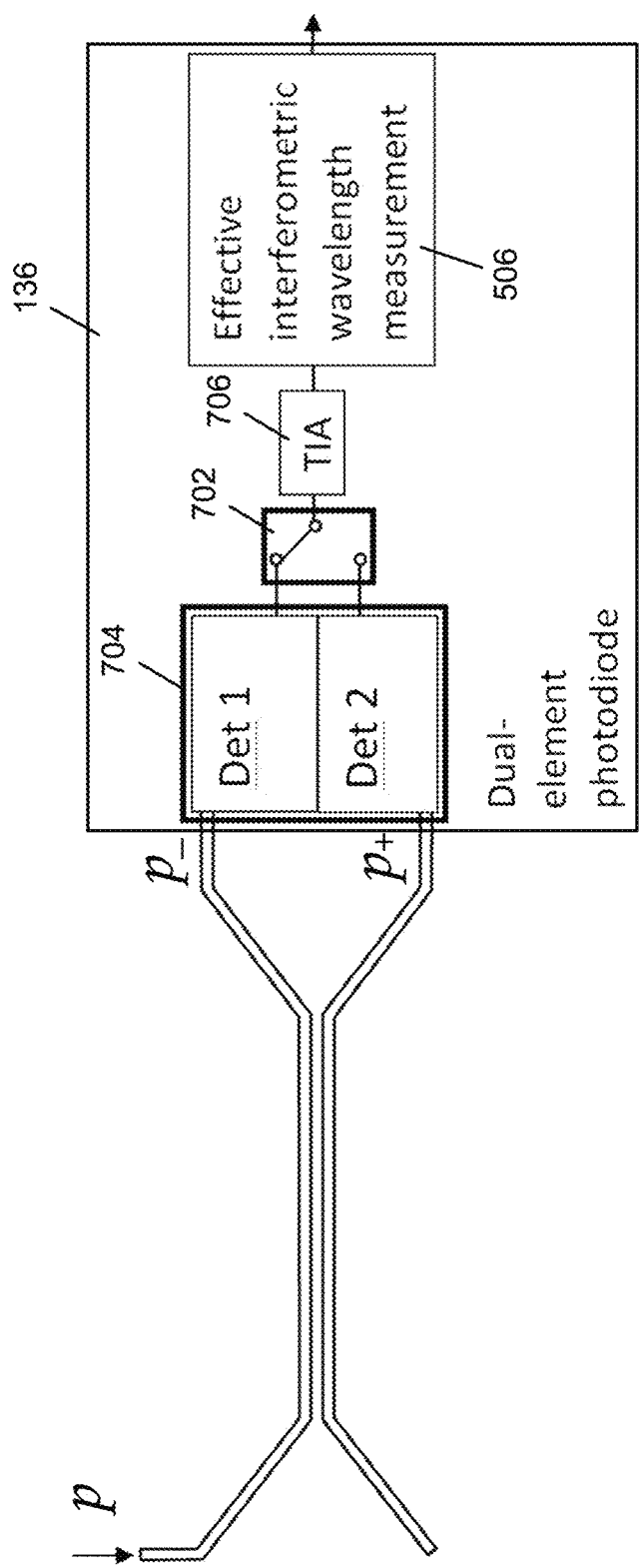
FIG. 7 shows yet another example embodiment of a wavemeter detector according to the invention.

In an alternative embodiment, an electronic switch 702 may be used to switch between the signals from the dual photodiode 704 so that the photocurrents and processed by the same TIA 706, as shown in FIG. 7. The arrangement of this embodiment may eliminate the error induced by using a pair of unbalanced TIAs.

Figure 8:
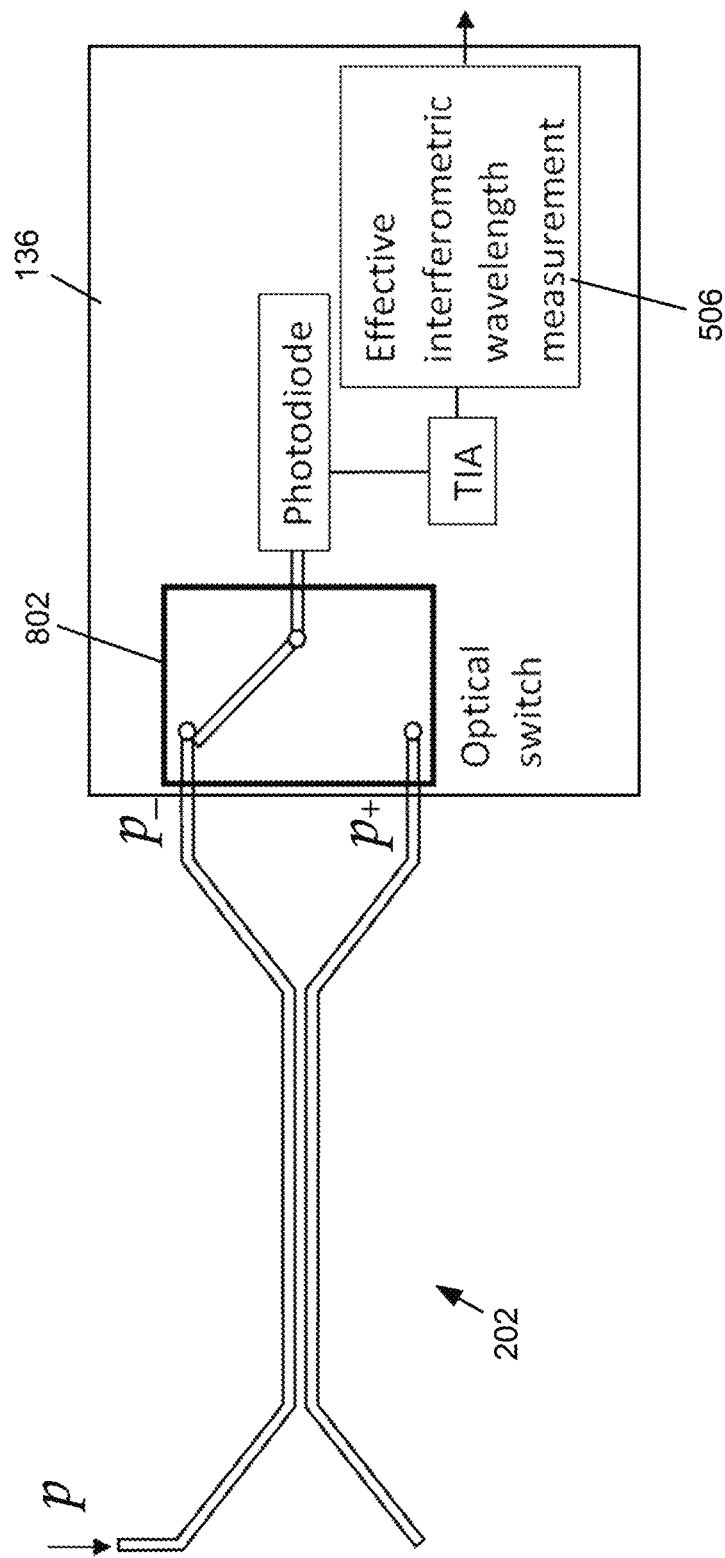
FIG. 8 shows a further example embodiment of a wavemeter detector according to the invention.

In another embodiment, an optic switch 802 may be used that is immediately connected to the output ports of the directional coupler 202, to switch between the optic signals from the two waveguides to single photodetector, as shown in FIG. 8. In this embodiment, the two optic signals from the directional coupler 202 may be converted in sequence into electrical signals by one detector, and pre-amplified by one TIA. The arrangement of this embodiment may eliminate the error due to a pair of unbalanced detection systems.

In an embodiment, the optic wavemeter may be fabricated based on the planar single-mode and single-polarization waveguides on silicon substrate using material and process compatible with fabrication of microelectronic circuits. The wavemeter of the described embodiments has the advantages of compass size, low fabrication and assemble cost, small exposure to environments, robust in operation, and a high spectral resolution in a predetermined spectral range of a FOG.

Figure 9:
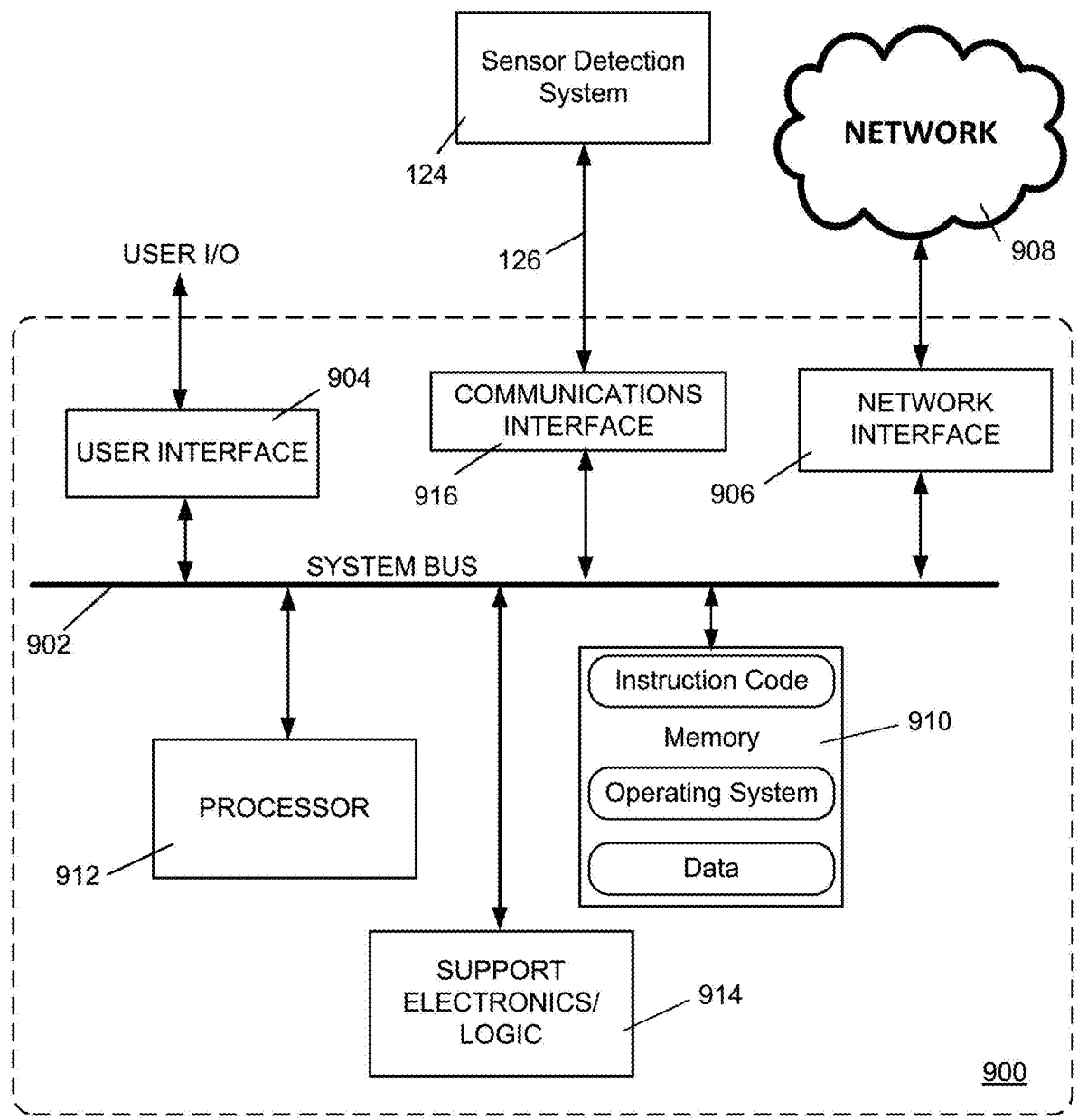
FIG. 9 is a diagram of an example internal structure of a processing system that may be used to implement one or more of the embodiments herein.

FIG. 9 is a diagram of an example internal structure of a processing system 900 that may be used to implement one or more of the embodiments herein. Each processing system 900 contains a system bus 902, where a bus is a set of hardware lines used for data transfer among the components of a computer or processing system. The system bus 902 is essentially a shared conduit that connects different components of a processing system (e.g., processor, disk storage, memory, input/output ports, network ports, etc.) that enables the transfer of information between the components.

Attached to the system bus 902 is a user I/O device interface 904 for connecting various input and output devices (e.g., keyboard, mouse, displays, printers, speakers, etc.) to the processing system 900. A network interface 906 allows the computer to connect to various other devices attached to a network 908. Memory 910 provides volatile and non-volatile storage for information such as computer software instructions used to implement one or more of the embodiments of the present invention described herein, for data generated internally and for data received from sources external to the processing system 900.

A central processor unit 912 is also attached to the system bus 902 and provides for the execution of computer instructions stored in memory 910. The system may also include support electronics/logic 914, and a communications interface 916. The communications interface may convey information to be processed by the central processor unit 912, for example the rotation measurement signal 126 from the sensor detection system 124.

In one embodiment, the information stored in memory 910 may comprise a computer program product, such that the memory 910 may comprise a non-transitory computer-readable medium (e.g., a removable storage medium such as one or more DVD-ROM's, CD-ROM's, diskettes, tapes, etc.) that provides at least a portion of the software instructions for the invention system. The computer program product can be installed by any suitable software installation procedure, as is well known in the art. In another embodiment, at least a portion of the software instructions may also be downloaded over a cable communication and/or wireless connection.

It will be apparent that one or more embodiments described herein may be implemented in many different forms of software and hardware. Software code and/or specialized hardware used to implement embodiments described herein is not limiting of the embodiments of the invention described herein. Thus, the operation and behavior of embodiments are described without reference to specific software code and/or specialized hardware—it being understood that one would be able to design software and/or hardware to implement the embodiments based on the description herein.

Further, certain embodiments of the example embodiments described herein may be implemented as logic that performs one or more functions. This logic may be hardware-based, software-based, or a combination of hardware-based and software-based. Some or all of the logic may be stored on one or more tangible, non-transitory, computer-readable storage media and may include computer-executable instructions that may be executed by a controller or processor. The computer-executable instructions may include instructions that implement one or more embodiments of the invention. The tangible, non-transitory, computer-readable storage media may be volatile or non-volatile and may include, for example, flash memories, dynamic memories, removable disks, and non-removable disks.

While example embodiments have been particularly shown and described, it will be understood by those skilled in the art that various changes in form and details may be made therein without departing from the scope of the embodiments encompassed by the appended claims.

What is claimed is:

1. An optic wavemeter for measuring an optic wavelength, comprising:
a first optic waveguide to guide at least a portion of an optic signal, derived from broadband light, for an interaction length, and to produce a first processed optic signal;
a second optic waveguide, a segment of which is arranged in close proximity to the first optic waveguide, the segment extending along an interaction length, such that the second optic waveguide receives a portion of the optic signal from first optic waveguide through evanescent coupling along the interaction length, and produces a second processed optic signal;
a first photodetector configured to receive the first processed optic signal and produce a first analog signal;
a second photodetector configured to receive the second processed optic signal to produce a second analog signal;
a processor; and
a memory with computer code instructions stored thereon, the memory operatively coupled to the processor such that, when executed by the processor, the computer code instructions combine first analog signal and the second analog signal as a ratio of (i) a sum of the first analog signal and the second analog signal and (ii) a difference of the first analog signal and the second analog signal, wherein the ratio is interpreted as the measured optic wavelength.

2. A system for stabilizing a scale factor associated with an optic rotation sensor, comprising:
(i) the optic rotation sensor, comprising:
a light source to emit broadband light;
a rotation sensing optic system that comprises a fiber optic sensing coil configured to propagate counter-propagating light beams sourced from the broadband light, an optic phase modulator to modulate the phase difference between the counter-propagating light beams, and an optic signal generated from an interaction of the counter-propagating light beams in response to a rotation of the optic rotation sensor; and
a sensor detection system that comprises a photodetector to produce a rotation measurement signal as a function of the optic signal from the optic rotation sensor system, and a first microprocessor-based controller configured to execute instruction code that causes a modulating signal to be applied to the optic phase modulator;
(ii) a wavemeter coupled to the optic rotation sensor, comprising:
a first optic waveguide to guide at least a portion of one of the optic signal of the broadband light for an interaction length, and to produce a first processed optic signal;
a second optic waveguide, a segment of which is arranged in close proximity to the first optic waveguide, the segment extending along an interaction length, such that the second optic waveguide receives a portion of the optic signal from first optic waveguide through evanescent coupling along the interaction length, and produces a second processed optic signal;
a first photodetector configured to receive the first processed optical signal and produce a first analog signal;
a second photodetector configured to receive the second processed optic signal to produce a second analog signal;
a processor; and
a memory with computer code instructions stored thereon, the memory operatively coupled to the processor such that, when executed by the processor, the computer code instructions combine the first analog signal and the second analog signal as a ratio of (i) a sum of the first analog signal and the second analog signal and (ii) a difference of the first analog signal and the second analog signal, wherein the ratio is interpreted as a measured optic wavelength; and
(iii) a microprocessor-based controller, and additional computer code instructions that, when executed by the microprocessor-based controller, generate a corrected rotation measurement signal based on the rotation measurement signal, the effective interferometric wavelength, a calibrated scale factor, and a calibrated wavenumber.

3. The system of claim 2, wherein the first optic waveguide and the second optic waveguide are each characterized by values of parameters w, s, and l, and specific values of each of w, s, and l are selected such that a phase difference of supermodes of the first optic waveguide and the second optic waveguide, at the effective interferometric wavelength of the broadband light source, is equal to a phase modulation implemented by the optic rotation sensor.

4. The system of claim 3, wherein the selection of the specific values of each of w, s, and l is accomplished when the phase modulation implemented by the optic rotation sensor is substantially equal to $\pi/2$.

5. The system of claim 2, wherein the wavemeter is connected to the optic rotation sensor to receive at least a portion of the optic signal from an optic path between the rotation sensing optic system and the sensor detection system.

6. The system of claim 5, wherein a 2×2 waveguide directional coupler is utilized to couple at least a portion of the optic signal from the optic rotation sensor to the wavemeter.

7. The system of claim 5, wherein a multimode interference coupler is utilized to couple at least a portion of the optic signal from the optic rotation sensor to the wavemeter.

8. The system of claim 2, wherein the wavemeter is connected to the optic rotation sensor to receive at least a portion of the broadband light from an optic path between the broadband light source and the rotation sensing optic system.

9. The system of claim 8, wherein a 2×2 waveguide directional coupler is utilized to couple at least a portion of the optic signal from the optic rotation sensor to the wavemeter.

10. The system of claim 8, wherein a multimode interference coupler is utilized to couple at least a portion of the optic signal from the optic rotation sensor to the wavemeter.

11. The system of claim 2, wherein the first optic waveguide and the second optic waveguide comprise one or more Si-CMOS compatible materials, and the first and second optic waveguides are fabricated using one or more Si-CMOS compatible processes.

12. The system of claim 11, wherein the first and second optic waveguides comprise silicon nitride as the waveguide core, and silicon oxide as the waveguide cladding material.

13. The system of claim 2, wherein the wavemeter further comprises:
    a first photodiode that implements the first photodetector, the first photodiode configured to receive the first processed optic signal;
    a first transimpedance amplifier to convert a first current from the first photodiode into a first voltage and deliver the first voltage to an effective interferometric wavelength measurement unit;
    a second photodiode that implements the second photodetector, the second photodiode configured to receive the second processed optic signal; and
    a second transimpedance amplifier to convert a second current from the second photodiode into a second voltage and deliver the second voltage to the effective interferometric wavelength measurement unit.

14. The system of claim 2, wherein the wavemeter further comprises:
    a symmetric dual-element photodiode that implements the first photodetector and the second photodetector, the symmetric dual-element photodiode configured to receive the first processed optic signal and the second processed optic signal;
    a first transimpedance amplifier to convert a first current from a first element of the dual-element photodiode into a first voltage and deliver the first voltage to an effective interferometric wavelength measurement unit; and
    a second transimpedance amplifier to convert a second current from a second element of the dual-element photodiode into a second voltage and deliver the second voltage to the effective interferometric wavelength measurement unit.

15. The system of claim 2, wherein the wavemeter further comprises:
    a symmetric dual-element photodiode that implements the first photodetector and the second photodetector, the symmetric dual-element photodiode configured to receive the first processed optic signal and the second processed optic signal; and
    an electronic switch configured to selectively couple a first input and a second input to an output, the first input coupled to a first element of the symmetric dual-element photodiode, the second input coupled to a second element of the symmetric dual-element photodiode, and the output coupled to a transimpedance amplifier, the electronic switch further configured to selectively couple the first and second inputs to the output with a predetermined frequency;
    the transimpedance amplifier configured to convert a current from the output into a voltage, and to deliver the voltage to an effective interferometric wavelength measurement unit.

16. The system of claim 2, wherein the wavemeter further comprises:
    an optic switch configured to alternatively guide, with a predetermined frequency, the first processed optic signal and the second processed optic signal to a photodiode that implements the first photodetector and the second photodetector; and
    a transimpedance amplifier configured to convert a current from the photodiode into a voltage, and deliver the voltage to an effective interferometric wavelength measurement unit.

17. A system for stabilizing a scale factor associated with a fiber optic gyroscope (FOG), comprising:
    an optic rotation sensor configured to produce a rotation measurement signal as a function of a rotation of the FOG;
    a wavemeter coupled to the optic rotation sensor, comprising:
    a first optic waveguide to guide at least a portion of broadband light from the optic rotation sensor for an interaction length, and to produce a first processed optic signal;
    a second optic waveguide, a segment of which is arranged in close proximity to the first optic waveguide, the segment extending along an interaction length, such that the second optic waveguide receives a portion of the optic signal from first optic waveguide through evanescent coupling along the interaction length, and produces a second processed optic signal;
    a first photodetector configured to receive the first processed optical signal and produce a first analog signal;
    a second photodetector configured to receive the second processed optic signal to produce a second analog signal;
    a processor;
    a memory with computer code instructions stored thereon, the memory operatively coupled to the processor such that, when executed by the processor, the computer code instructions combine the first analog signal and the second analog signal as a ratio of (i) a sum of the first analog signal and the second analog signal and (ii) a difference of the first analog signal and the second analog signal, wherein the ratio is interpreted as a measured optic wavelength; and
    a microprocessor-based controller and additional computer code instructions stored on the memory, the additional computer code instructions, when executed by the microprocessor-based controller, generate a corrected rotation measurement signal based on the rotation measurement signal, the effective interferometric wavelength, a calibrated scale factor, and a calibrated wavenumber.

* * * * *